(12) United States Patent
Elam et al.

(10) Patent No.: US 7,709,056 B2
(45) Date of Patent: May 4, 2010

(54) SYNTHESIS OF TRANSPARENT CONDUCTING OXIDE COATINGS

(75) Inventors: Jeffrey W. Elam, Elmhurst, IL (US); Alex B. F. Martinson, Evanston, IL (US); Michael J. Pellin, Naperville, IL (US); Joseph T. Hupp, Northfield, IL (US)

(73) Assignee: UChicago Argonne, LLC, Chicago, IL (US)

( * ) Notice: Subject to any disclaimer, the term of this patent is extended or adjusted under 35 U.S.C. 154(b) by 0 days.

(21) Appl. No.: 11/804,059

(22) Filed: May 16, 2007

(65) Prior Publication Data

US 2008/0286448 A1 Nov. 20, 2008

(51) Int. Cl.
*B05D 1/00* (2006.01)
(52) U.S. Cl. .................................. 427/255.32
(58) Field of Classification Search ............ 427/255.34, 427/255.32, 255.35
See application file for complete search history.

(56) References Cited

U.S. PATENT DOCUMENTS 5,147,688 A * 9/1992 Melas .................... 427/255.32
6,061,117 A * 5/2000 Horie et al. .................. 349/156
6,503,561 B1 * 1/2003 Senzaki et al. ............... 427/226
7,250,083 B2 * 7/2007 Sneh ............................ 117/84
2005/0266700 A1 * 12/2005 Jursich et al. ............... 438/785
2006/0062916 A1 * 3/2006 Won .......................... 427/248.1
2007/0092648 A1 * 4/2007 Duren et al. ........... 427/255.31

OTHER PUBLICATIONS

Jeffrey W. Elam et al, Chem Mater, 2006, 18, 3571-3575.*
Jeong-Woon Bae et al, Japanese Journal of Applied Physics, vol. 38, part 1(1999)2917-2920.*
M. Usuda et al, Journal of Electronic Materials, vol. 25, No. 3(1996)407-409.*

* cited by examiner

*Primary Examiner*—Michael Cleveland
*Assistant Examiner*—Tabassom Tadayyon Eslami
(74) *Attorney, Agent, or Firm*—Foley & Lardner LLP

(57) ABSTRACT

A method and system for preparing a light transmitting and electrically conductive oxide film. The method and system includes providing an atomic layer deposition system, providing a first precursor selected from the group of cyclopentadienyl indium, tetrakis (dimethylamino) tin and mixtures thereof, inputting to the deposition system the first precursor for reaction for a first selected time, providing a purge gas for a selected time, providing a second precursor comprised of an oxidizer, and optionally inputting a second precursor into the deposition system for reaction and alternating for a predetermined number of cycles each of the first precursor, the purge gas and the second precursor to produce the oxide film.

18 Claims, 13 Drawing Sheets

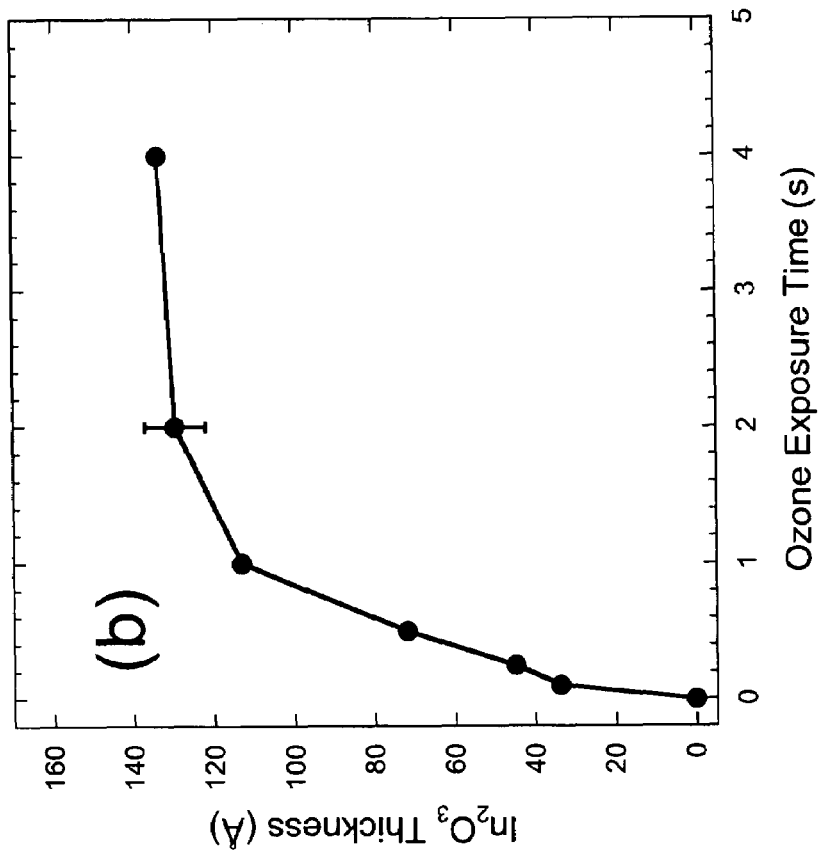
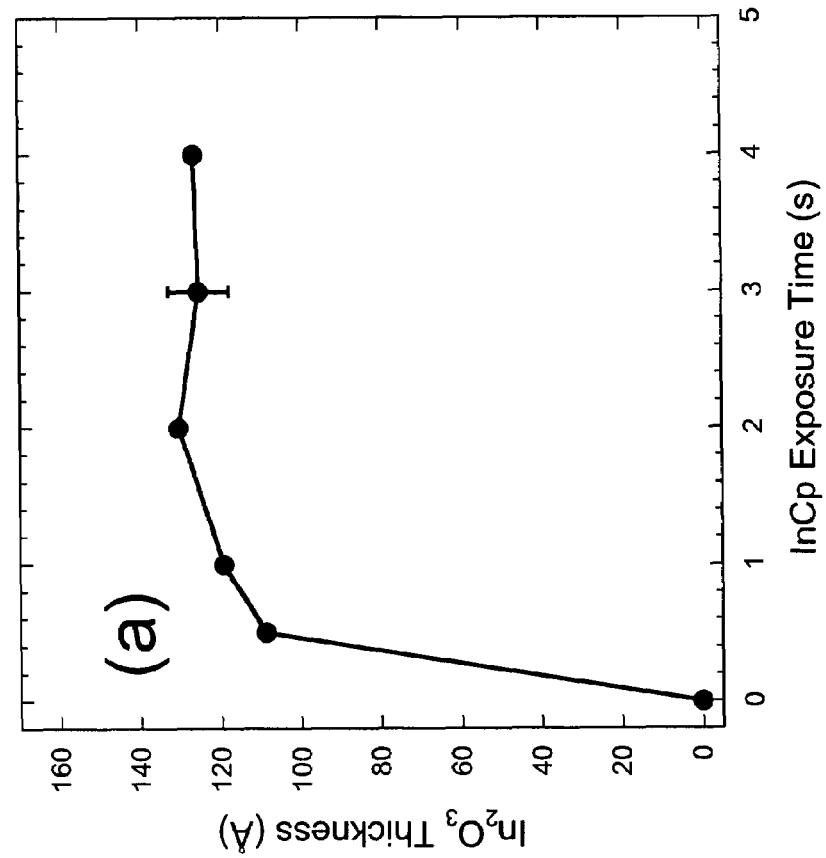
Figure 2a
Figure 2b

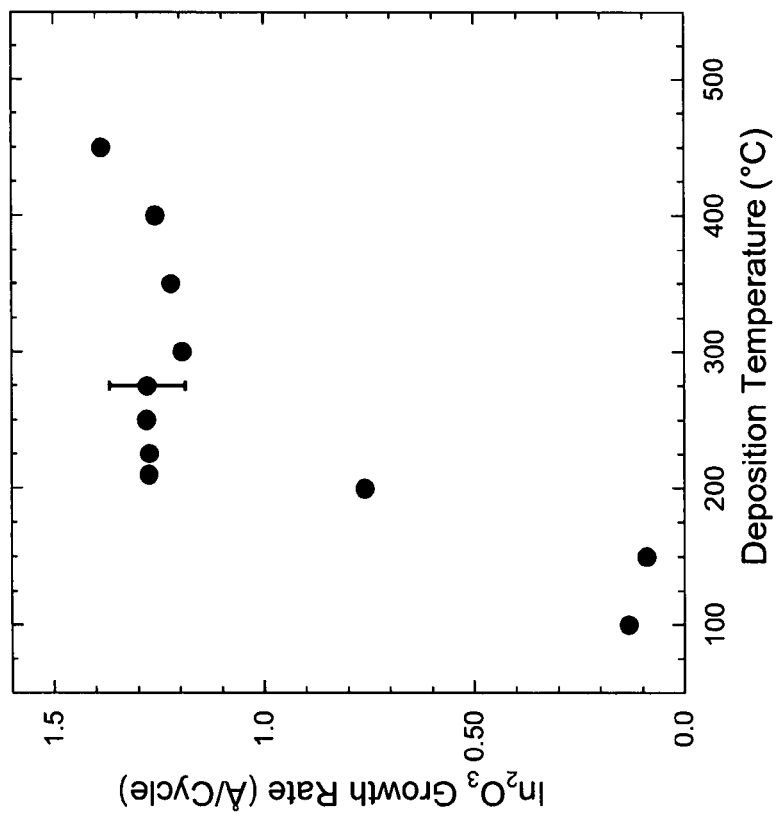
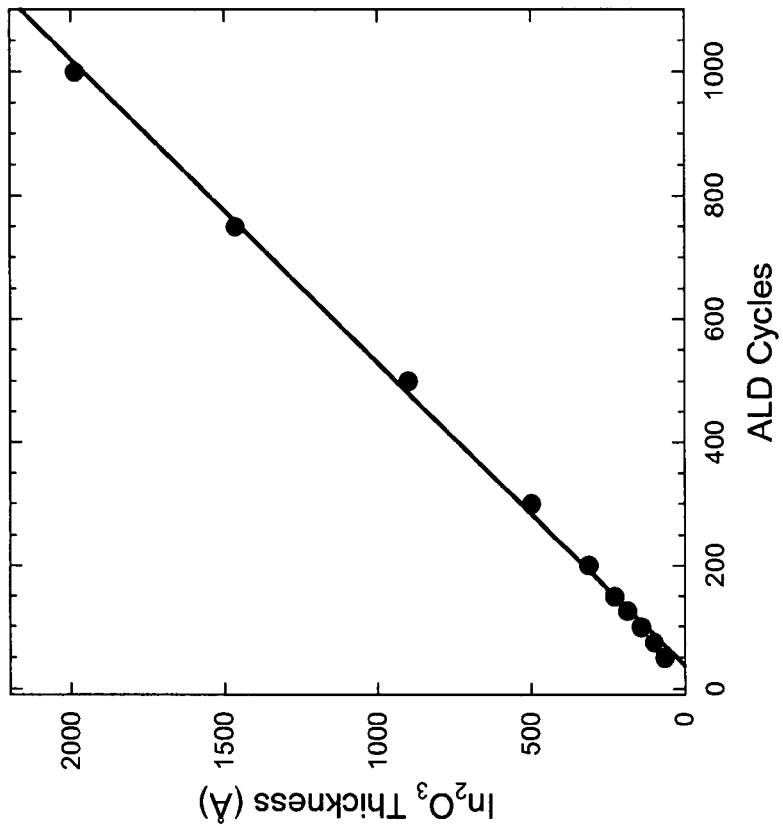
Figure 3a
Figure 3b

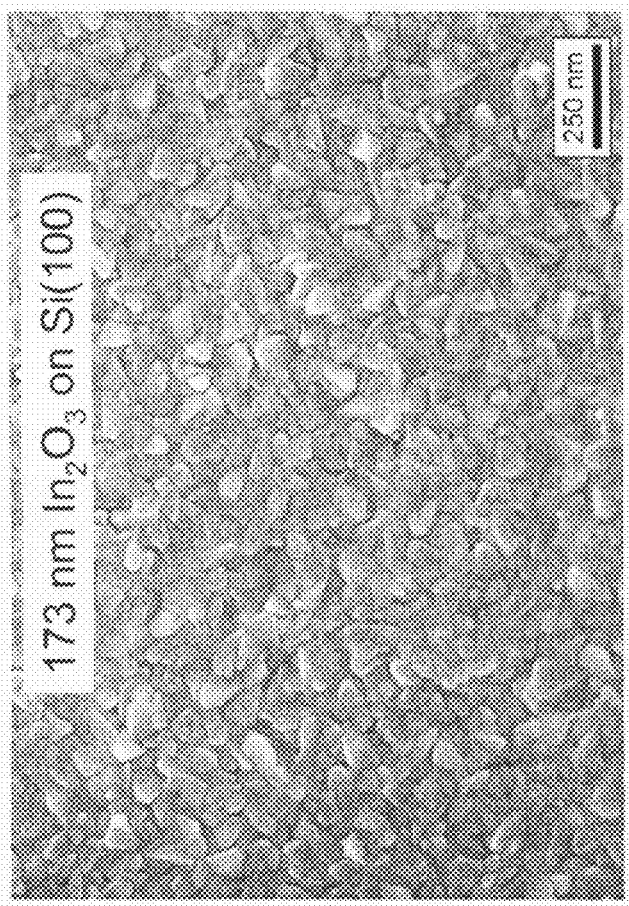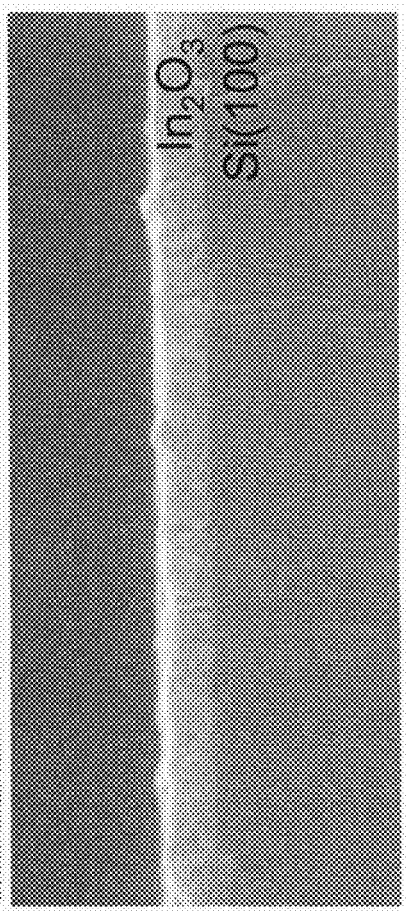
Figure 4a
Figure 4b

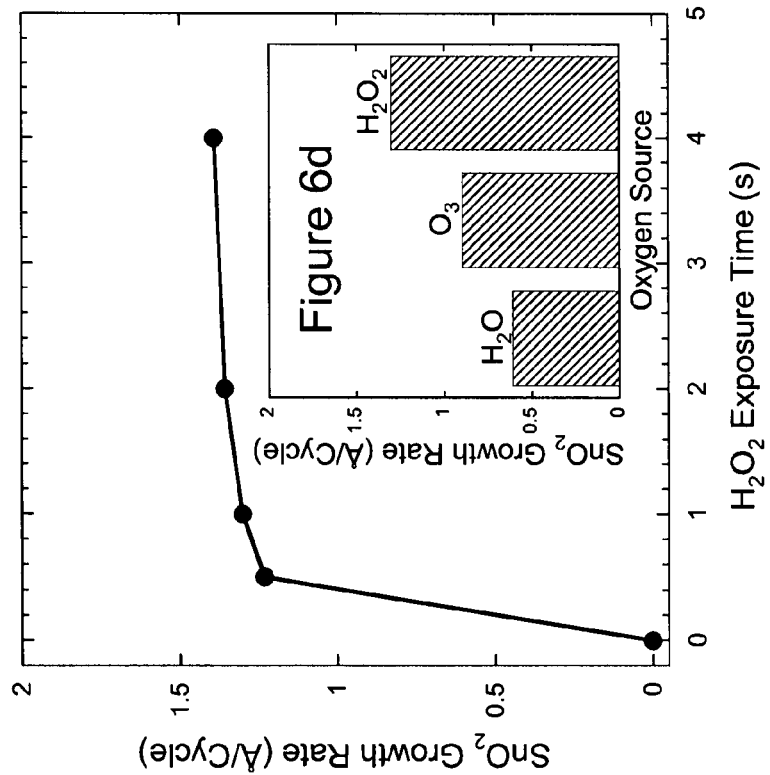
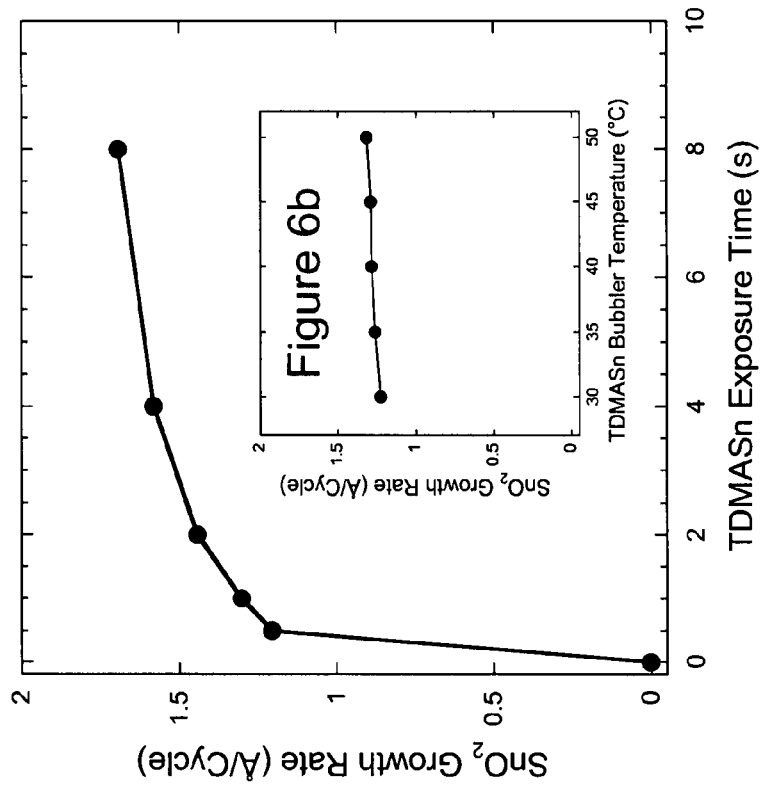

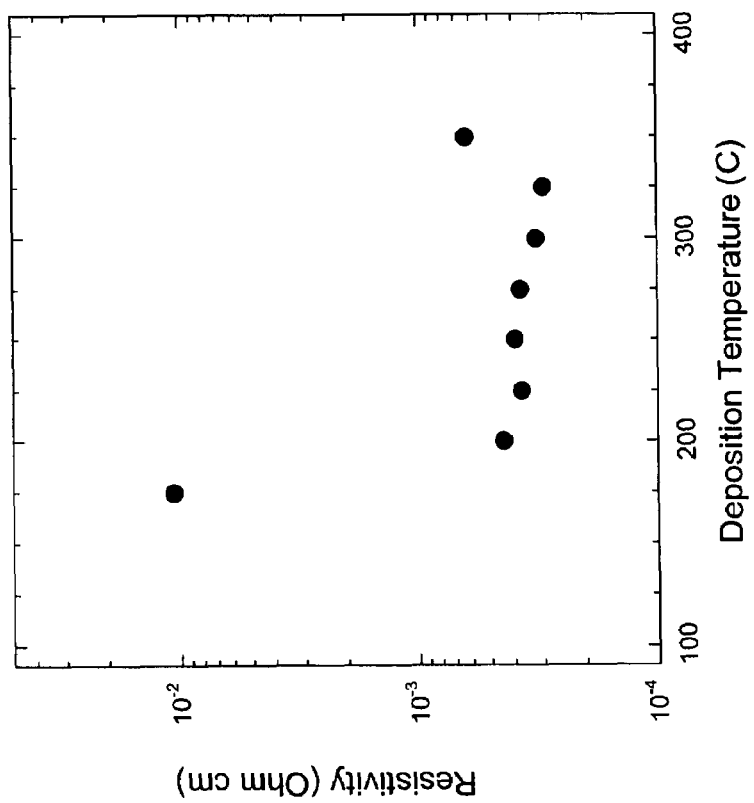
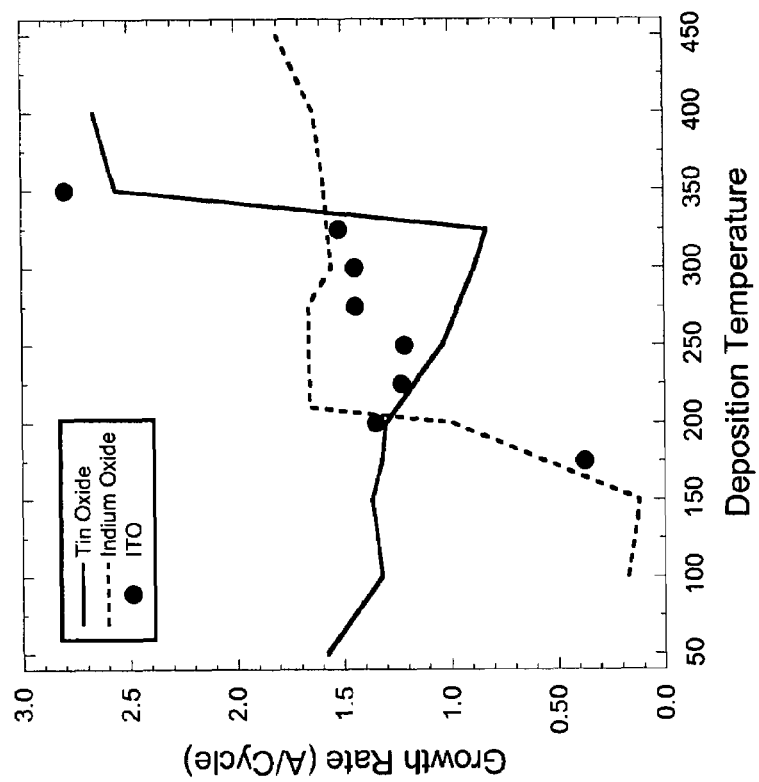
Figure 11b
Figure 11a

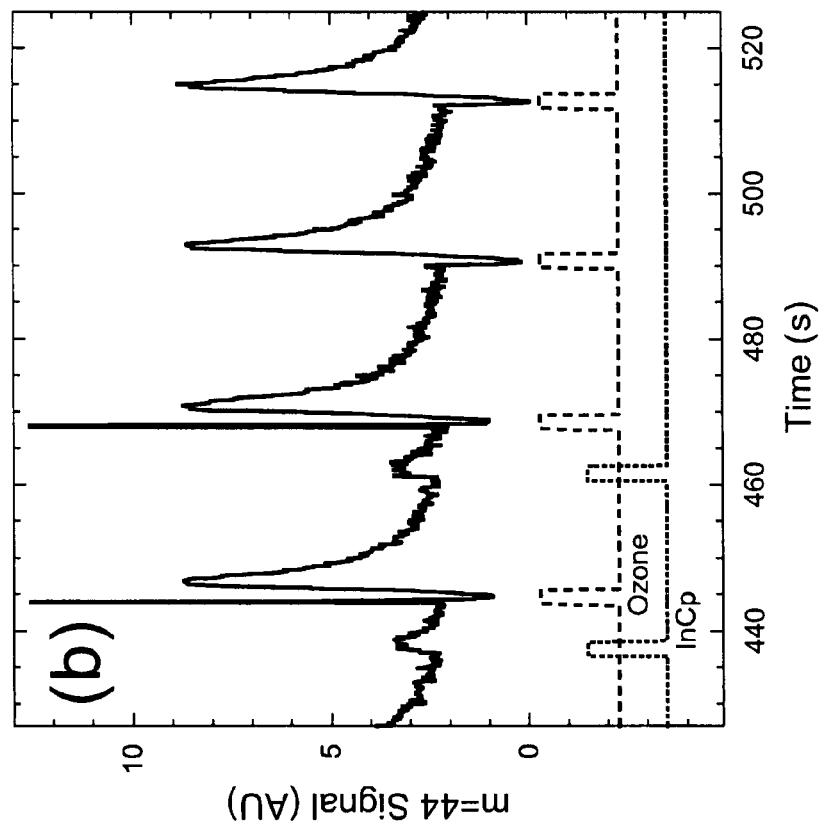
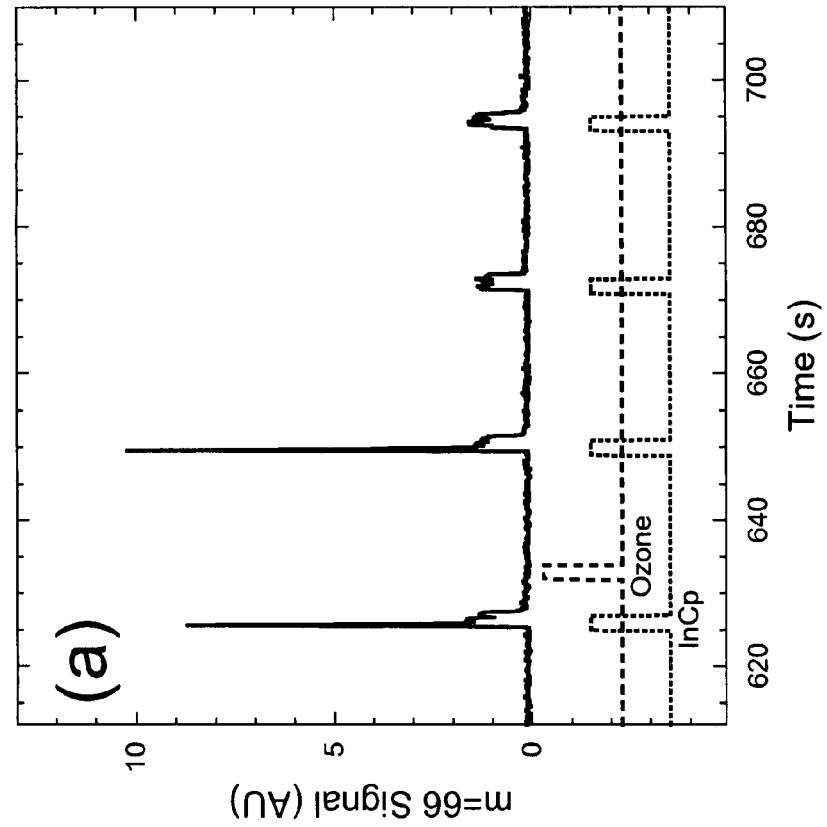
Figure 12a
Figure 12b

US 7,709,056 B2

SYNTHESIS OF TRANSPARENT CONDUCTING OXIDE COATINGS

The United States Government has certain rights in this invention pursuant to Contract No. DE-AC02-06CH11357 between the United States Department of Energy and UChicago Argonne, LLC as operator of Argonne National Laboratories.

The present invention is directed to a method and system for synthesis of transparent conductive oxide coatings and is also related to an article of manufacture. More particularly, the invention is directed to a method and system for preparation of indium oxides, tin oxides and indium-tin oxides which are highly transparent and exhibit low resistivity.

BACKGROUND OF THE INVENTION

Indium oxide ($In_2O_3$), tin oxide ($SnO_2$) and indium tin oxide (ITO), have substantial advantages for use as transparent conducting oxides which are employed, for example, in optoelectonic devices, flat panel displays and photovoltaic devices and which are also useful in gas sensors and as catalysts. In these types of applications, it can be helpful for device performance to have precise control over film thickness and composition, and some applications require the ability to coat high aspect ratio geometries or porous materials. $In_2O_3$ thin films can be deposited using a variety of methods including sputtering, chemical vapor deposition, and atomic layer deposition (ALD). Of these techniques, ALD shows the most significant promise as this method affords excellent control over both the thickness and the composition of the deposited film. Most importantly, ALD offers excellent deposition conformality that enables the coating of porous materials with aspect ratios in excess of 1000.

Previously, $In_2O_3$ deposition by ALD has been accomplished using $InCl_3$ with either $H_2O$ or $H_2O_2$ as the oxygen source. Although useful for coating planar surfaces, this method suffers from several limitations. First, the $InCl_3$ chemistry requires high growth temperatures of ~300-500° C. and yields a low growth rate of only 0.25-0.40 Å/cycle. In addition, the $InCl_3$ has a very low vapor pressure and must be heated to 285° C. just to saturate a planar surface. Furthermore, the corrosive HCl byproduct can damage the deposition equipment. But the greatest limitation of the $InCl_3/H_2O$ method, especially for coating nanoporous materials, is that $InCl_3$ can etch the deposited $In_2O_3$. Consequently, nanoporous materials require very long precursor exposures that are likely to completely remove the $In_2O_3$ from the outer portions of the nanoporous substrate.

An improved ALD process for $In_2O_3$ has also been sought for many years and a number of alternate precursors have been investigated including β-diketonates ($In(hfac)_3$ (hfac=hexafluoropentadionate), $In(thd)_3$ (thd=2,2,6,6-tetramethyl-3,5-heptanedioneate), and $In(acac)_3$ (acac=2,4-pentanedionate)) and trimethyl indium, ($In(CH_3)_3$). Unfortunately, these efforts were unsuccessful. No growth was observed using β-diketonates with water or hydrogen peroxide, while trimethyl indium did not yield self-limiting growth.

SUMMARY OF THE INVENTION

A method and system are described for producing light transmitting (including light transparent) as well as highly conductive oxides which includes without limitations indium oxide, tin oxide, indium-tin oxide and doped variations of these oxides. Atomic layer deposition is preferably used to reactively form these articles with a high degree of control of the chemistry, as well as forming the desired layers more rapidly and also depositing the oxide layers onto substrates of high aspect ratio and porous materials. These oxides are prepared by use of a precursor of cyclopentadienyl indium for the indium oxide films and tetrakis (dimethylamino) tin for preparation of tin oxide films. Reactive preparation of these films was accomplished by introduction of ozone and/or hydrogen peroxide as part of an alternating exposure with the indium and tin precursors. The number of cycles of each component and time of each cycle can be adjusted to achieve a desired deposition result. Various dopants can also be added as part of the preparation process to produce a wide variety of optical and electrical characteristics for the product film. These and other features of the invention will be described in more detail hereinafter with reference to the figures described below.

BRIEF DESCRIPTION OF THE DRAWINGS

FIG. 2A illustrates $In_2O_3$ thickness growth versus InCp exposure time; and FIG. 2B illustrates $In_2O_3$ thickness growth versus ozone exposure time;

FIG. 3A illustrates $In_2O_3$ thickness as a function of ALD cycles; and FIG. 3B illustrates $In_2O_3$ growth rate versus deposition temperature.

FIG. 4A illustrates a plan view SEM image of a 100 nm ALD $In_2O_3$ film deposited on Si(100); and FIG. 4B illustrates a cross-sectional image of a 100 nm ALD $In_2O_3$ film deposited on Si(100)

FIG. 6A illustrates $SnO_2$ growth rate as a function of TDMASn exposure time; and inset FIG. 6B illustrates $SnO_2$ growth rate as a function of bubbler temperature; and FIG. 6C illustrates $SnO_2$ growth rate as a function of $H_2O_2$ exposure time; and FIG. 6D illustrates $SnO_2$ thickness as a function of oxygen source.

FIG. 11A illustrates ITO growth rate as a function of deposition temperature; and FIG. 11B illustrates ITO resistivity as a function of deposition temperature.

FIG. 12A illustrates QMS signal for m=66 (cyclopentadiene, solid line) versus time during alternating exposures to InCp (dotted line) and $O_3$ (dashed line) at 250° C. using the timing sequence: 2-5-2-15; FIG. 12B illustrates QMS signal for m=44 ($CO_2$) recorded using the same conditions as FIG. 12A.

DETAILED DESCRIPTION OF PREFERRED EMBODIMENTS

Figure 1:
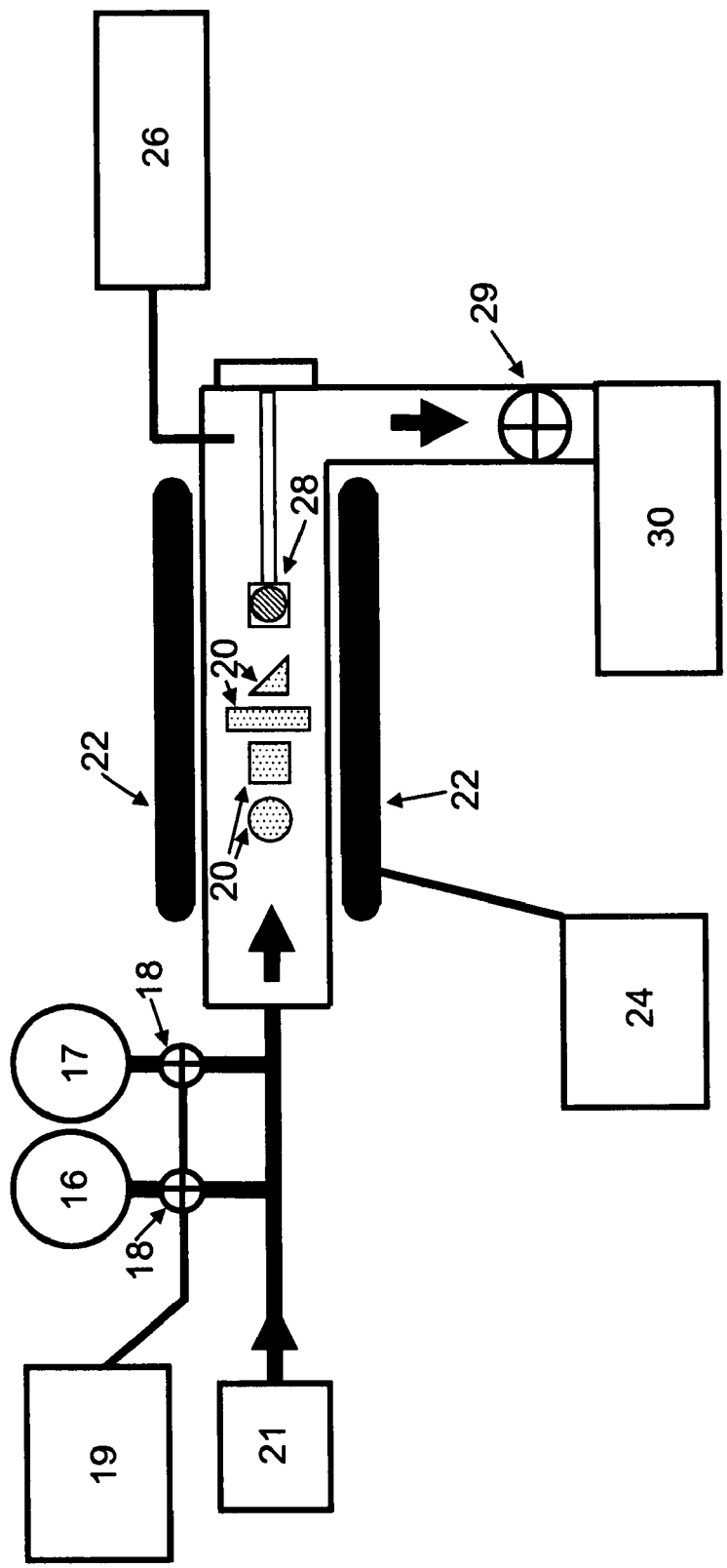
FIG. 1 illustrates a schematic of a system for producing a conducting oxide thin film.

A system for producing a conducting oxide film in accordance with the invention is indicated generally at 10 in FIG. 1. In the preferred embodiment shown in FIG. 1 the system 10 includes device 15 comprised of a conventional atomic layer depositing ("ALD") apparatus and method, such as described in U.S. Pat. No. 4,058,430, which is incorporated by reference herein. Other known deposition systems are useable. The system 10 can include various sources for precursor vapors. The sources can be in gaseous, solid, or liquid form, but the partial pressure of the precursor is typically adjusted by heating, cooling, or pressure regulation to be preferably in the range of approximately 0.01 to 10 Torr which is appropriate for reaction and deposition. The system 10 can therefore include precursor sources 16 and 17 as well as additional precursor sources controlled by valves 18 and a valve control 19. The system 10 can further include a purge gas source 21, such as a $N_2$ gas source which flows in the direction indicated by the arrows in FIG. 1. The ALD device 15 can also include a heater 22 operated using a control 24. Various monitoring and measurement devices can be employed to ensure deposition of the desired product oxide onto a selected substrate or collection of substrates 20 and deposition monitored by various devices, such as a mass spectrometer 26 and quartz crystal microbalance 28. A thin film is deposited onto the selected substrate 20 by means of alternating saturated surface chemical reactions. These reactions are carried out by inputting gaseous or vaporized source materials alternately into the device 15, and rinsing the reactor with an inert gas, such as from the purge gas source 21, between the source material inputs. In the device 15, the film growth occurs through saturated surface reactions with film growth being self-controlled. Consequently, in such a well-controlled form of the device 15 film thickness and film elemental composition can be precisely controlled by the number of reaction cycles.

In, the case of producing $In_2O_3$, the ALD process was performed using alternating exposures to cyclopentadienyl indium (InCp, Strem, electronic grade 99.999+% In) and ozone. The InCp is held in a stainless steel bubbler maintained at 40° C., and the tubing connecting the bubbler to the ALD reactor is maintained at 200° C. to prevent the deposition of InCp on the reactor walls. Ultrahigh purity nitrogen (99.999%) at a mass flow rate of 60 sccm was sent through the bubbler during the InCp exposures and was diverted to bypass the bubbler following the InCp exposures. The ozone was produced using a commercial ozone generator (Ozone Engineering L11) using a feed of ultrahigh purity oxygen at a flow rate of 400 sccm to produce ~10% ozone in oxygen.

The ALD timing sequences can be expressed as t1-t2-t3-t4, where t1 is the exposure time for the first precursor, t2 is the purge time following the first exposure, t3 is the exposure time for the second precursor, t4 is the purge time following the exposure to the second precursor, and all units are given in seconds (s). The timing sequence for $In_2O_3$ ALD was typically 2-4-2-2 s; but this is subject to typical changes of the device 15, gas flow reaction and other experimental variables, all of which can be readily adjusted to achieve the advantageous results set forth herein.

A QCM was installed in the ALD reactor of the device 15 in place of the substrate 20 enabling in situ measurements during the $In_2O_3$ growth. These measurements utilized a Maxtek BSH-150 bakeable sensor and AT-cut quartz sensor crystals with a polished front surface obtained from the Colorado Crystal Corp., part no. CCAT1BK-1007-000. The QCM measurements were made using a Maxtek TM400 film thickness monitor interfaced to a personal computer. In addition, the ALD reactor was equipped with a QMS (Stanford Research Systems RGA300) located downstream of the QCM in a differentially pumped chamber separated from the reactor tube by a 35 μm orifice and evacuated using a 50 L/s turbomolecular pump.

$In_2O_3$ ALD films were deposited on 1 cm×2 cm Si(100) and glass substrates. Prior to loading, the substrate 20 was ultrasonically cleaned in acetone and then 2-propanol and blown dry using nitrogen. After loading, the substrate 20 was allowed to outgas in the ALD reactor for 10 min at the deposition temperature (typically 250° C.) in 1 Torr of flowing ultrahigh purity nitrogen. Next, the substrate 20 was cleaned in situ using a 60 s exposure to 10% ozone in oxygen at a pressure of 2 Torr and a mass flow rate of 400 sccm. We observed a reactor conditioning effect in which the thicknesses of the $In_2O_3$ films deposited immediately following $Al_2O_3$ growth were thinner than expected. To compensate for this effect, we always deposited an $In_2O_3$ buffer layer on the inside of the reactor using ~100 InCp/$O_3$ cycles following deposition of a different material.

SEM images were acquired using a Hitachi S4700 scanning electron microscope with a field emission gun electron beam source, secondary electron and backscattered electron detectors, and an energy dispersive analysis of X-rays (EDAX) detector for elemental analysis. AFM measurements were performed on a Digital Instruments Dimension 3000 with a NanoScope IIIa controller operated in tapping mode. XRD measurements were taken on a Rigaku Miniflex Plus diffractometer. Ellipsometric measurements of the $In_2O_3$ films deposited on Si(100) surfaces were performed using a J. A. Woolam Co. M2000 variable angle spectroscopic ellipsometer using a table of refractive indexes for $In_2O_3$ supplied with the instrument. Optical absorption spectra were acquired from ALD $In_2O_3$ films deposited on glass using the M2000 operated in transmission mode and were fit to a model using the same $In_2O_3$ optical constants. AAO membranes (Whatman Anodisc 13) with pore diameters of 200 nm and a membrane thickness of 70 μm were also coated by $In_2O_3$ and will be described hereinafter. Prior to SEM analysis, cleaved cross sections of the membranes were embedded in conducting epoxy and polished with progressively finer diamond polishing compound ending with 0.25 μm.

Various detailed in situ measurements and evaluations were performed as part of the characterization of the process of producing transparent conducting oxides. These measurements and evaluations are set forth in detail in the Example hereinafter.

$In_2O_3$ was deposited on various substrates, including (100) silicon and glass substrates. FIG. 2A shows the results of uptake measurements made while varying the exposure time to InCp using the timing sequence x-2-2-2 at 250° C. substrate temperature. This figure demonstrates self-limiting behavior for InCp for exposure times of ~2 s. FIG. 2B shows a similar graph exploring the effect of increasing ozone exposures using the timing sequence 2-2-x-2 and demonstrates self-limiting $In_2O_3$ growth for ozone exposure times beyond ~2 s. Increasing the InCp and $O_3$ purge times did not affect the $In_2O_3$ growth rates, indicating that purge times $\geq 2$ s are sufficient to avoid mixing the precursors. For the remainder of the measurements, a timing sequence of 2-4-2-2 was used unless otherwise noted. It should be noted that these timing sequences are subject to modification given the parameters, such as, geometry and operational details of the device 15, the precursor, the temperature of the substrate 20 and gas flows.

FIG. 3A reveals nearly linear $In_2O_3$ growth over the range of 50-1000 InCp/$O_3$ cycles at an average growth rate of 2.0 Å/cycle. Detailed inspection of the plot reveals that the $In_2O_3$ growth rate actually increases somewhat with the number of cycles from 1.3 to 2.0 Å/cycle over the range of 50-2000 ALD cycles. Without limiting the scope of the invention, this increase probably results from an increase in surface area with the evolution and growth of the $In_2O_3$ nanocrystals. Gradual changes in ALD growth rates have been observed previously for nanocrystalline materials in which the morphology or crystal size evolves with film thickness. The effect of substrate deposition temperature on the $In_2O_3$ growth is shown in FIG. 3B. The $In_2O_3$ growth rate drops precipitously below 200° C.; and without limiting the scope of the invention, this may occur because 200° C. is the threshold temperature below which ozone no longer decomposes to form oxygen radicals necessary for $In_2O_3$ growth. Between 200 and 450° C., the $In_2O_3$ growth rate is nearly constant at 1.2-1.4 Å/cycle. At 500° C., it was difficult to control the film thickness because most of the InCp decomposed at the leading edge of the sample holder in the reactor.

We also examined the variation in $In_2O_3$ film thickness along the flow direction of the reactor. Using the 2-4-2-2 timing sequence, the film thickness was constant for the first ~15 cm of the reactor, after which the film thickness dropped off by 53% over 22 cm. The film uniformity improved using 15 s of $O_3$ exposure times so that the thickness decreased by only 33% over 22 cm, but the thickness variation was unaffected using longer InCp exposure times. We attribute this behavior to the depletion of ozone along the flow direction of the reactor. The results of the film growth studies are summarized in the Table where we compare the InCp/$O_3$ process with the existing $In_2O_3$ ALD process using $InCl_3$/$H_2O_2$.

TABLE

Comparison of $InCl_3$ and InCp Precursors for $In_2O_3$ ALD

| | indium precursor $InCl_3$ | InCp |
|---|---|---|
| oxygen source | $H_2O_2$ | $O_3$ |
| ALD temperature window (° C.) | 300-500 | 200-450 |
| precursor temperature (° C.) | 285 | 40 |
| growth rate (Å/cycle) | 0.40 | 2.0 |
| precursor etching? | yes | no |
| reference | Ritala 1998 | this work |

XRD measurements for a 176 nm film deposited on glass at 275° C. match closely cubic, polycrystalline $In_2O_3$. AFM studies reveals a relatively rough, nanocrystalline topography for a 100 nm $In_2O_3$ film deposited on Si(100) and yield a root-mean-squared (RMS) roughness of R=3.96 nm for a 1×1 μm scan. The RMS roughness increases somewhat to R=4.9 and 5.8 nm for scan sizes of 2×2 and 10×10 μm, respectively. Nanocrystals with a lateral dimension of 50-100 nm are evident in the plan view SEM image for the 100 nm $In_2O_3$ sample on Si(100) shown in FIG. 4A, and the cross-sectional SEM images (FIG. 4B) demonstrate that the $In_2O_3$ films are dense and free of voids, pinholes, or cracks.

The optical transmission spectrum of a 173 nm thick $In_2O_3$ film deposited on glass yields an average transmission of the $In_2O_3$ film over the wavelength range 400-1000 nm of T=90.0% and is comparable to ALD $In_2O_3$ films deposited previously using $InCl_3$/$H_2O$. This film had a resistivity of $16 \times 10^{-3}$ Ωcm which is somewhat higher than the value of $(3-6) \times 10^{-3}$ Ωcm obtained using $InCl_3$/$H_2O$, suggesting that the $O_3$ used in our process produces a more perfect $In_2O_3$ stoichiometry with fewer oxygen vacancies resulting in increased resistivity.

Figure 5B:
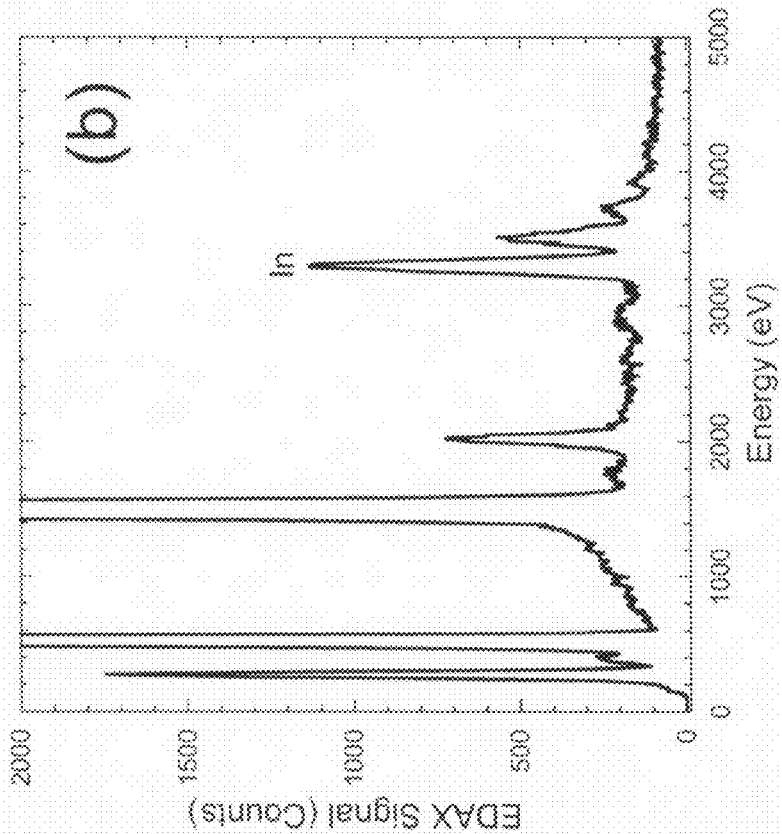
FIG. 5B illustrates an EDAX spectrum from the center of the specimen of FIG. 5A.
Figure 5A:
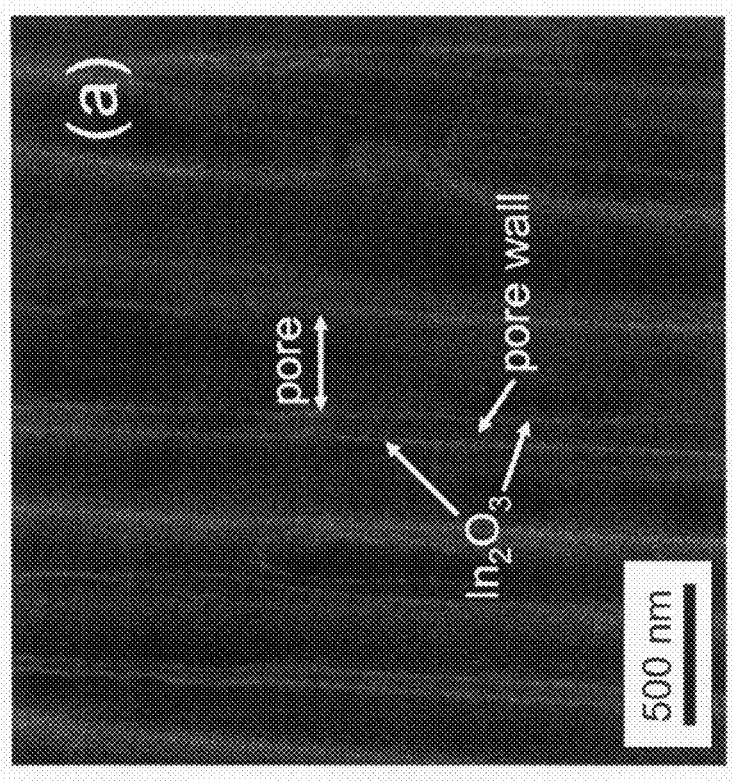
FIG. 5A illustrates a back scattered electron image of an AAO membrane 70 microns thick, a 200 nm pore diameter and coated at 275° C. with $In_2O_3$ 13 nm thickness.

Anodic aluminum oxide ("AAO" hereinafter) membranes were also coated with $In_2O_3$ using 80 InCp/$O_3$ cycles at 250° C. The AAO had an initial pore diameter d=200 nm and thickness L=70 μm such that the aspect ratio is L/d=350. To allow gaseous diffusion of the precursors into the high aspect ratio pores, relatively long ALD cycle times of 60-15-60-15 were used. FIG. 5A shows a backscattered electron image recorded from the middle of a cleaved cross section of the AAO membrane. The white lines visible on the edges of the AAO nanopores are the $In_2O_3$ coating and appear brighter than the surrounding $Al_2O_3$ because the higher-Z indium backscatters electrons more efficiently. Because this sample was polished prior to imaging, the white lines are not likely caused by edge contrast. In fact, the pore structure was practically invisible in secondary electron images (not shown). FIG. 5B shows an EDAX spectrum taken from the same location at the center of the AAO membrane, and the prominent In $L_\alpha$ peak at 3.29 keV demonstrates that the ALD $In_2O_3$ completely infiltrates the high aspect ratio AAO membrane. The intensity of the In Lα peak decreases by only 20% between the edge and the middle of the membrane, indicating very high conformality of the ALD $In_2O_3$ coating. We also coated much higher aspect ratio AAO membranes (L/d=2300) using an identical treatment, but the coating was less conformal and the In Lα signal decreased by ~90% between the edge and the middle of the membrane. This is most likely due to a decrease in concentration of the $O_3$ or oxygen radicals along the very high aspect ratio pores.

In the case of producing $SnO_2$, ALD was performed using alternating exposures to tetrakis(dimethylamino) tin (TDMASn, Gelest, >95% purity) and hydrogen peroxide ($H_2O_2$, Aldrich, 30 wt % in water). The TDMASn is held in a stainless steel bubbler maintained at 40° C., and the tubing connecting the bubbler to the ALD reactor is maintained at 150° C. to prevent condensation of the TDMASn on the reactor walls. All of the measurements in FIGS. 6A-6D were performed by depositing $SnO_2$ films on Si(100) substrates that were first coated with ~1 nm ALD $Al_2O_3$ using 10 cycles of trimethyl aluminum and $H_2O_2$. The ALD $Al_2O_3$ was used to prepare a chemically reactive surface with a high density of surface hydroxyl groups to facilitate the subsequent $SnO_2$ ALD. The thicknesses of the $SnO_2$ film was then determined using spectroscopic ellipsometry for the data in FIGS. 6A-6D. FIG. 6A shows the effect of varying the TDMASn exposure time on the $SnO_2$ growth rate and demonstrates self-limiting growth for exposure times exceeding ~2 s. FIG. 6B shows the effect of varying the TDMASn bubbler temperature on the $SnO_2$ growth rate and exhibits saturation for bubbler temperatures exceeding 30° C. FIG. 6C shows the effect of varying the $H_2O_2$ exposure time on the $SnO_2$ growth rate and shows saturated growth for $H_2O_2$ exposure times greater than ~0.5 s. FIG. 6D presents the $SnO_2$ growth rates observed using different oxygen containing precursors and shows that the $H_2O_2$ yields the highest $SnO_2$ growth rate.

Figure 7B:
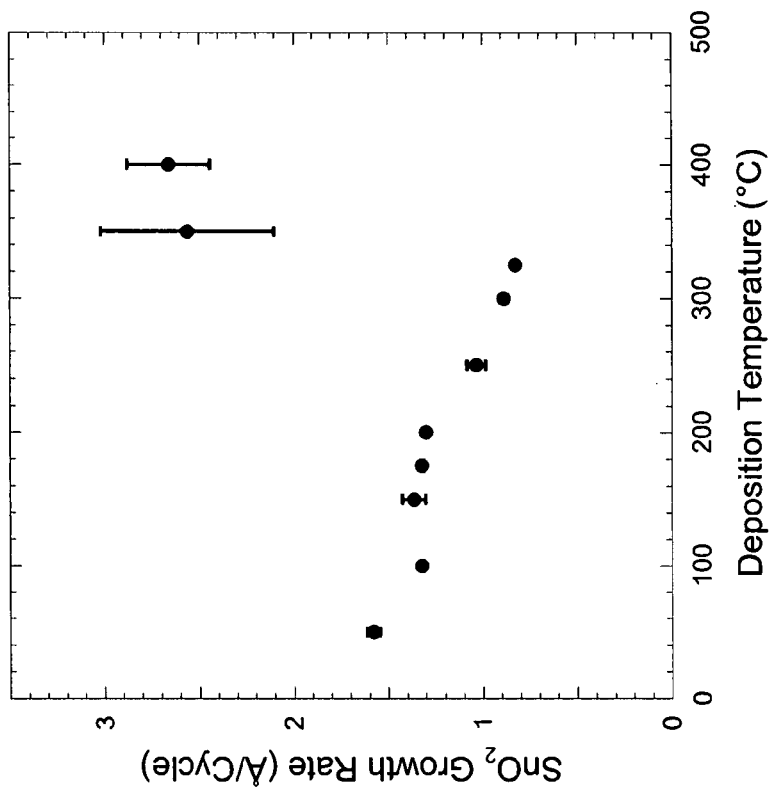
FIG. 7B illustrates $SnO_2$ growth rate versus deposition temperature.
Figure 7A:
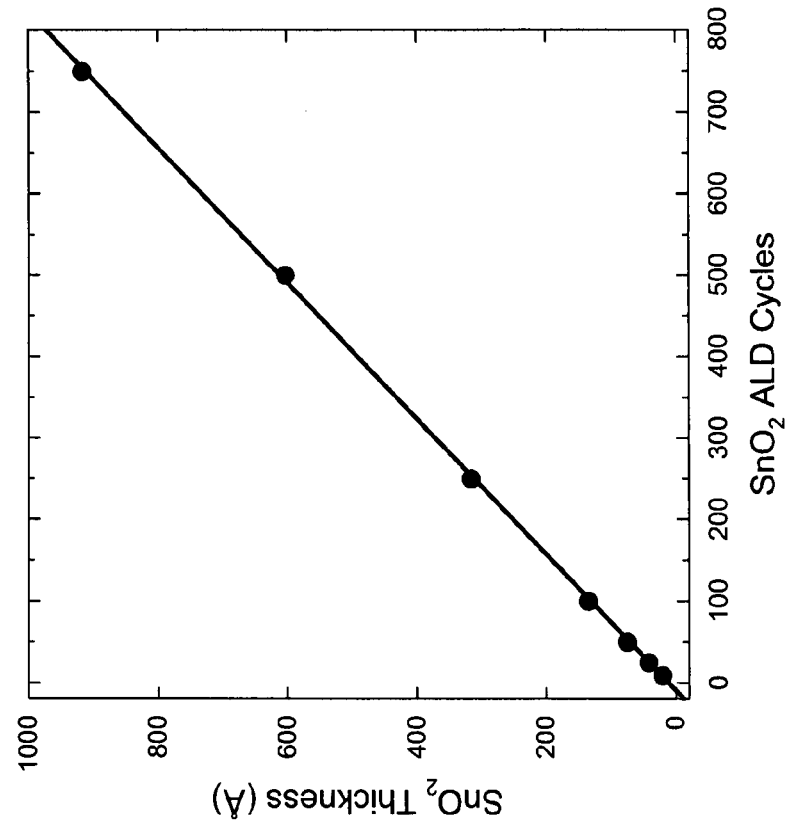
FIG. 7A illustrates $SnO_2$ thickness as a function of ALD cycles.

FIG. 7A shows the effect of varying the number of TDMASn/$H_2O_2$ cycles between 10 and 750 cycles. These films were deposited on Si(100) substrates at 150° C. using the timing sequence 1-5-1-5 after first depositing 1 nm ALD $Al_2O_3$. This figure yields an average growth rate of 1.2 Å/cycle. FIG. 7B shows the effect of varying the substrate temperature on the resulting $SnO_2$ growth rate. The $SnO_2$ growth rate decreases steadily between from 1.58 Å/cycle at 50° C. to 0.83 Å/cycle at 325° C., and this gradual decrease is consistent with a decrease in the number of surface hydroxyl groups as has been observed previously in $Al_2O_3$ ALD. The $SnO_2$ growth rate increases abruptly to 2.56 Å/cycle at 325° C. In addition, the $SnO_2$ films become less uniform in thickness at this higher temperature as indicated by the large error bars for these thickness measurements in FIG. 7B. These findings are consistent with the onset of thermal decomposition of the TDMASn precursor leading to non-self limited growth.

Figures 8A, 8B:
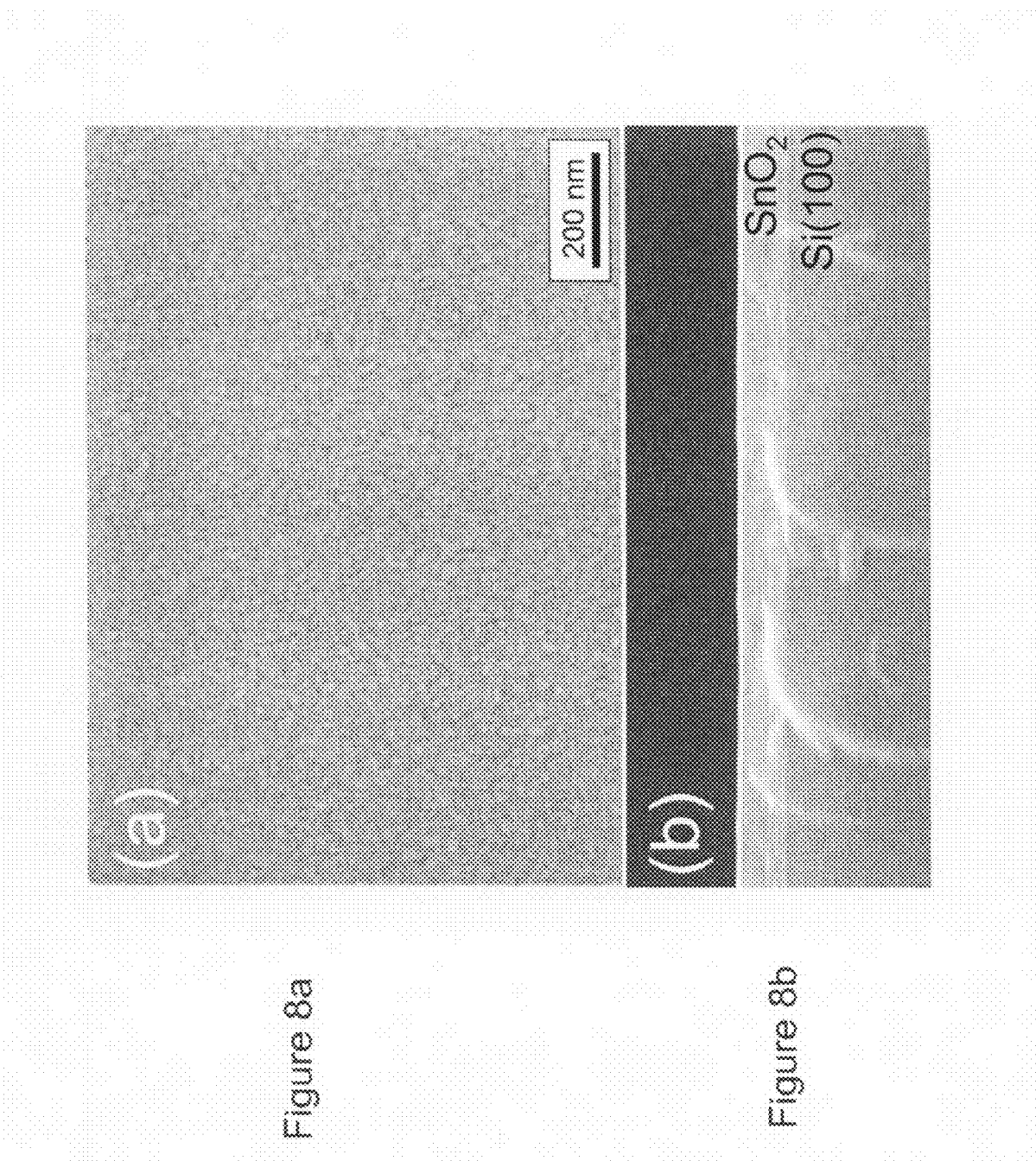
FIG. 8A illustrates a plan view SEM image of a 92 nm ALD $SnO_2$ film deposited on Si(100)
FIG. 8B illustrates a cross-sectional view SEM image of a 92 nm ALD $SnO_2$ film deposited on Si(100)

FIG. 8A shows a plan-view SEM image of the $SnO_2$ film with a thickness of 916 Å deposited on Si(100) at a temperature of 150° C. This SEM image is nearly featureless, and this is consistent with the amorphous structure observed in the XRD data measured for the film of similar thickness deposited on glass. The cross-sectional SEM image of this film in FIG. 8B shows a smooth, conformal and flat film with no evidence of granularity as would be seen for a crystalline film. AFM analysis of this film shows a very smooth surface and yields an RMS roughness of 0.85 nm. Optical transmission measurements for an $SnO_2$ film with a thickness of 140 nm deposited on glass yields an average transmission in the range of 400-1000 nm of 94%.

The refractive indices for the $SnO_2$ films deposited by ALD using 100 cycles of TDMASn/$H_2O_2$ were determined by spectroscopic ellipsometry versus deposition temperature. At deposition temperatures above 200° C., the refractive index for the $SnO_2$ films was relatively constant in the range of 1.83-1.91. Below 200° C., the refractive index decreased steadily with deposition temperature to a value of 1.62 at a deposition temperature of 50° C. The elemental composition (Sn, O, C, and N content) of these films was determined using XPS measurements. The C content remains relatively constant at 5-6% and the N content is undetectable above 200° C. Below 200° C., the C and N contents increase with decreasing deposition temperature reaching 10 and 2%, respectively. In addition, the resistivity of the $SnO_2$ films deposited by ALD decreased with increasing deposition temperature from $2.8 \times 10^{-1}$ cm at 150° C. to $1.9 \times 10^{-3}$ Ωcm at 200° C.

The refractive index and elemental composition measurements for the films deposited above 200° C. are consistent with pure $SnO_2$. $SnO_2$ has a refractive index of 1.9. The constant value of 5-6% C probably results from contamination at the surface of the film from the air transfer between the ALD reactor in the device 15 and the XPS system. In contrast, the lower refractive index, lower conductivity and lower purity observed at the lower deposition temperatures are consistent with residual dimethylamino ligands remaining in the films. If we assume ~5% surface carbon contamination, then the C:N ratio in the films at the lower temperatures is ~2:1 as would be expected from dimenthylamine. While not limiting the scope of the invention, the lower refractive index is consistent with a lower density film as would be expected from these contaminants. It is plausible that the surface reactions do not proceed to completion at the lower deposition temperatures. Longer $H_2O_2$ exposures, or possibly using $O_3$ or oxygen radicals may lower the concentrations of C and N impurities in these films deposited at lower temperatures.

The film thickness determined from this SEM image FIG. 8B is 93 nm, in excellent agreement with the ellipsometric thickness measurement of 91.6 nm. This good agreement strengthens the finding that the refractive index from the ellipsometric measurements is 1.86, which agrees well with previous determinations of the refractive index for $SnO_2$, and suggests that the stoichiometry of our films is Sn:O=1:2. The XPS measurements on the $SnO_2$ films deposited by ALD yielded a stoichiometry of Sn:O=1:1. However, it is likely that the $SnO_2$ films deposited by ALD have an oxygen deficient surface layer, and only this surface layer is probed by the XPS measurements. Similar XPS measurements have been made on $SnO_2$ films deposited by ALD using $SnCl_4$.

As in the case of $In_2O_3$ described hereinbefore, conformal coating ability of this new ALD $SnO_2$ process was completed by coating an AAO membrane with a pore diameter of d=200 nm and a thickness of L=60 microns yielding an aspect ratio of L/d=300. After coating with an $SnO_2$ film with a thickness of 38 nm, the AAO membrane annealed in air at 400 C for 4 hours to induce crystallization thereby improving the contrast in SEM. SEM examination showed that the $SnO_2$ crystals are disposed on the inner surfaces of the two AAO pores, and the ALD $SnO_2$ film with a thickness of ~40 nm is also clearly evident as lining the inner walls of the two pores in a manner, such as was shown for $In_2O_3$ in FIG. 5A. The conformal $SnO_2$ films are more evident in the backscattered electron image of the same region of the AAO membrane that was collected simultaneously. The high contrast in this image results because the higher average atomic number of the $SnO_2$ (27) as compared to the surrounding $Al_2O_3$ (15) yields a much higher intensity of backscattered electrons.

Figure 9A:
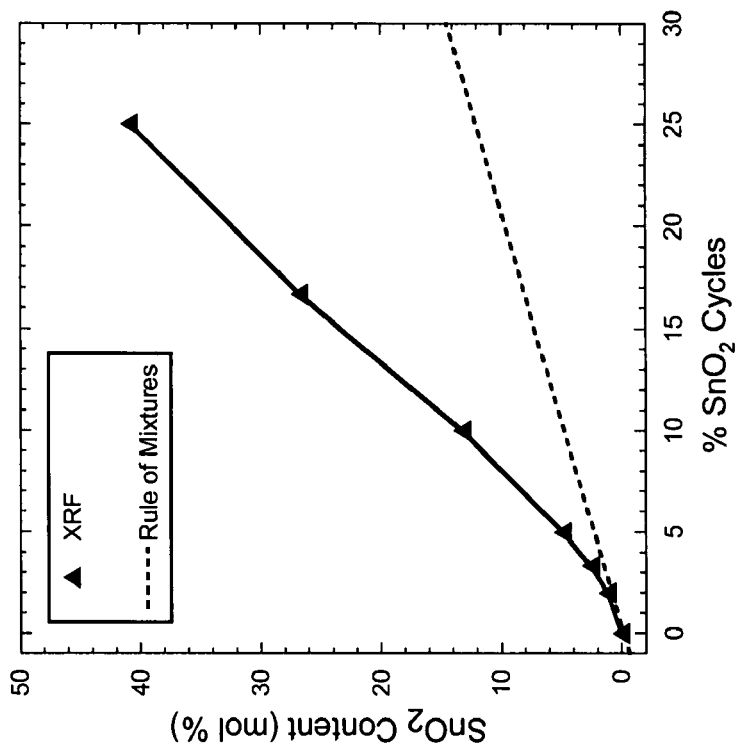
FIG. 9A illustrates growth rate versus percentage of $SnO_2$ cycles for ITO films.
Figure 9B:
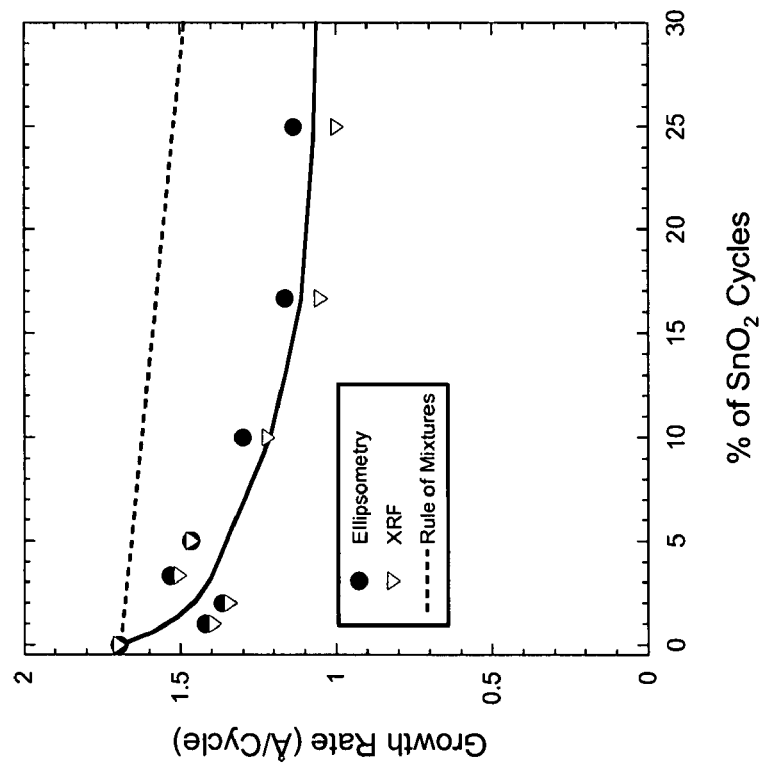
FIG. 9B illustrates $SnO_2$ content versus percentage of $SnO_2$ cycles for ITO films.

In a further aspect of the invention, the separate process for the ALD $In_2O_3$ and the ALD $SnO_2$ can be combined in different, controlled ratios to produce indium-tin oxide (ITO) and thereby to modify or improve the optical transmission and electrical conductivity. FIG. 9A shows the results of varying the percentage of $SnO_2$ cycles on the resulting ALD growth rate as determined by both ellipsometric measurements and XRF measurements. FIG. 9B shows the variation in $SnO_2$ content for the ITO films as a function of the percentage of $SnO_2$ cycles. The $SnO_2$ content is higher than predicted by a simple rule of mixtures formula because the $SnO_2$ impedes the $In_2O_3$ ALD resulting in lower than expected $In_2O_3$ content for these films. Nevertheless, the $SnO_2$ content can be precisely controlled in these ITO films over the range 0-40%.

Figure 10B:
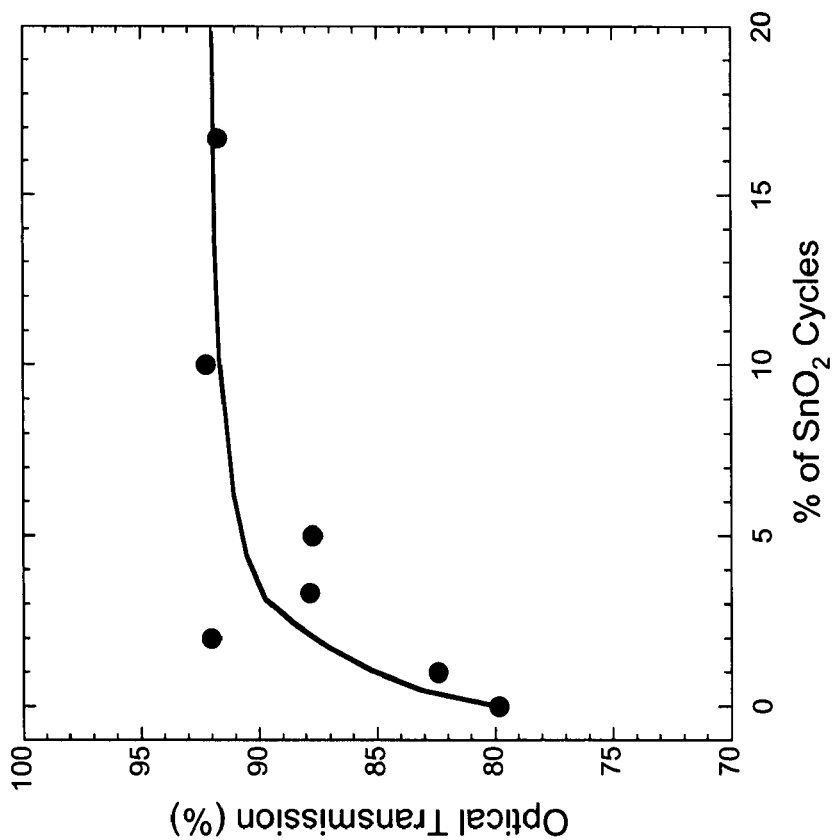
FIG. 10B illustrates optical transmission as a function of percent of Sn cycles.
Figure 10A:
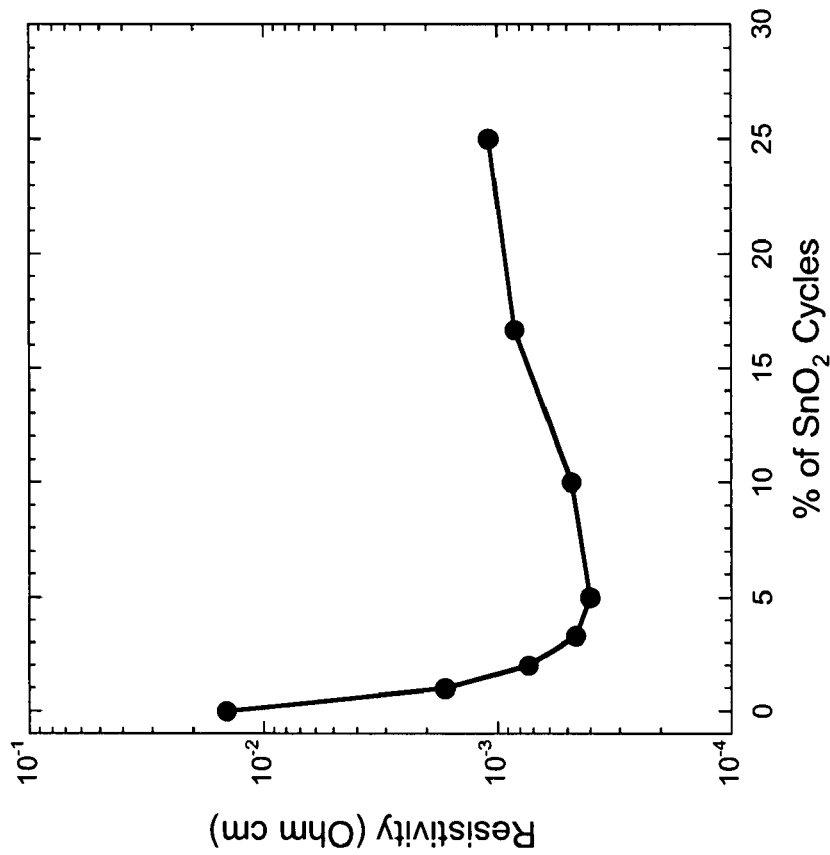
FIG. 10A illustrates resistivity of ITO deposited on glass at 275° C. as a function of $SnO_2$ cycles.

FIGS. 10A and 10B show the electrical resistivity and optical transmission of 40 nm ITO films on a glass substrate 20 at a deposition temperature of 275° C. for the glass substrate 20. There is a forty times increase in conductivity with Sn doping and an increase from 80% to 92% in transmission.

FIG. 11A shows the effect of varying the substrate temperature on the ITO growth rate for ITO films prepared using 5% $SnO_2$ cycles. The temperature dependence for the pure $In_2O_3$ and $SnO_2$ films are also shown for comparison. The ITO growth rate is nearly constant at 1.2-1.5 Å/cycle in the temperature range 200-325° C. The ITO growth rate increases dramatically at 350 C and this probably results from the thermal decomposition of the TDMASn precursor as this change is also observed for the pure SnO2 films. The ITO growth rate decreases dramatically below 200° C. and this probably results because the $O_3$ precursor for the $In_2O_3$ ALD is no longer activated at this low temperature as indicated by the drop-off in the $In_2O_3$ growth rate below 200° C. FIG. 11B shows the result of varying the substrate temperature on the resistivity of the ITO films prepared using 5% $SnO_2$ cycles. The ITO resistivity is nearly constant at $3-4 \times 10^{-4}$ Ohm cm over the same temperature range of 200-325° C. for which constant growth rate is seen in FIG. 11A.

$In_2O_3$ forms the basis for an important class of transparent conducting oxides (TCOs) that see wide use in optoelectronic devices, flat-panel displays and photovoltaics. In addition, $In_2O_3$, has applications in the fields of gas sensors and catalysis. $SnO_2$ is also a widely used TCO material, especially when doped with fluorine or antimony. $In_2O_3$ doped with $SnO_2$ (typically 10 weight percent) is one of the most widely used TCO materials. ITO is used in a wide variety of optoelectonic devices such as liquid crystal displays, touch panels, flat panel displays, plasma displays, organic light-emitting diodes, and solar cells. In addition, ITO is used in optics to make infrared reflecting coatings (hot mirrors) for architectural applications as well as for antistatic coatings.

The following non-limiting example illustrates various aspects of the invention.

EXAMPLE

In situ QCM and QMS measurements were used to investigate the mechanism for $In_2O_3$ ALD using InCp and $O_3$. These measurements were performed at 250° C. using the timing sequence 2-5-2-15. The $In_2O_3$ ALD process can be described by a generalized reaction scheme:

$$*+InCp \rightarrow InCp_x*+(1-x)\text{products} \qquad (1)$$

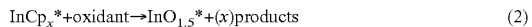

$$InCp_x*+\text{oxidant} \rightarrow InO_{1.5}*+(x)\text{products} \qquad (2)$$

In these reactions, the surface species are designated with an asterisk and x is the fraction of Cp ligands remaining on the surface following each InCp exposure. The gas-phase products, the initial reactive sites, and the oxidant are all left unspecified but will be determined from the in situ measurements.

QMS measurements were performed to determine the gas-phase products of the InCp and ozone half-reactions. Representative QMS data recorded during the InCp and $O_3$ half-reactions are shown in FIG. 1a,b, respectively. As shown in FIG. 12A, a peak at m=66 appears during the InCp half-reaction, but not during the $O_3$ half-reaction. When the InCp exposure follows an $O_3$ exposure, the m=66 peak has a sharp spike at the leading edge followed by a smaller plateau that persists as long as the InCp dosing valve is held open as illustrated by the first two ALD cycles in the figure. However, if no $O_3$ exposure precedes the InCp exposure, the sharp spike in the m=66 peak is absent as shown by the final two ALD cycles in FIG. 12A. From these observations we conclude that the sharp feature represents a gas-phase product of reaction 1, while the smaller plateau is simply decomposition of the InCp precursor in the QMS.

Similarly, we see a sharp spike in the m=44 signal coincident with the $O_3$ exposures that are preceded by InCp exposures (FIG. 12B); however, this spike is not seen when the InCp exposures are absent. Consequently, we conclude that m=44 is a gas-phase product of reaction 2. The small peak in the m=44 data coincident with the InCp exposures is present whether or not the InCp exposure is preceded by an $O_3$ exposure, and therefore this is a crack of InCp rather than a reaction product. The large, slow transient feature in the m=44 signal that appears during the purge cycle of each $O_3$ exposure results from a $CO_2$ impurity in the ultrahigh purity oxygen which is pumped slowly by our system.

By collecting QMS data over the mass range 12-115 amu, we discovered that m=44 ($CO_2$) is the only product of the $O_3$ reaction, while the InCp reaction yields the following products (and relative abundances): m=66 (100), 65 (67), 39 (53), and 40 (33). This mass pattern matches closely the fragmentation pattern for cyclopentadiene ($C_5H_6$). We also looked for the cyclopentadienyl dimer at m=132, but we found none. It is surprising that we do not observe water during the $O_3$ half-reaction. One explanation is that the hydrogen from the Cp ligands in reaction 2 remains on the surface as hydroxyl (OH) groups that subsequently react with InCp to form HCp (cyclopentadiene, m=66). This would explain why no m=18 is observed in reaction 2, while the main product from reaction 1 is m=66 rather than m=65.

The ratio of gas-phase products measured during the InCp and $O_3$ half-reactions can be used to calculate x in eqs (1) and (2). By integrating the product mass peaks observed during the InCp exposures and correcting for variations in electron multiplier gain, quadrupole transmission, and ionization efficiency, we calculate that the amount of Cp released during eq (1) is (in arbitrary units) 1−x=15. Similarly, after correcting for the relative effusion rate of $CO_2$ versus cyclopentadiene, the amount of $CO_2$ released during eq 2 is 5x=13.8, where the quantity 5x accounts for the fact that five $CO_2$ molecules are released from each Cp ligand. Combining these expressions, (1−x)/(5x)=1.09 so that x=0.15.

Figure 13B:
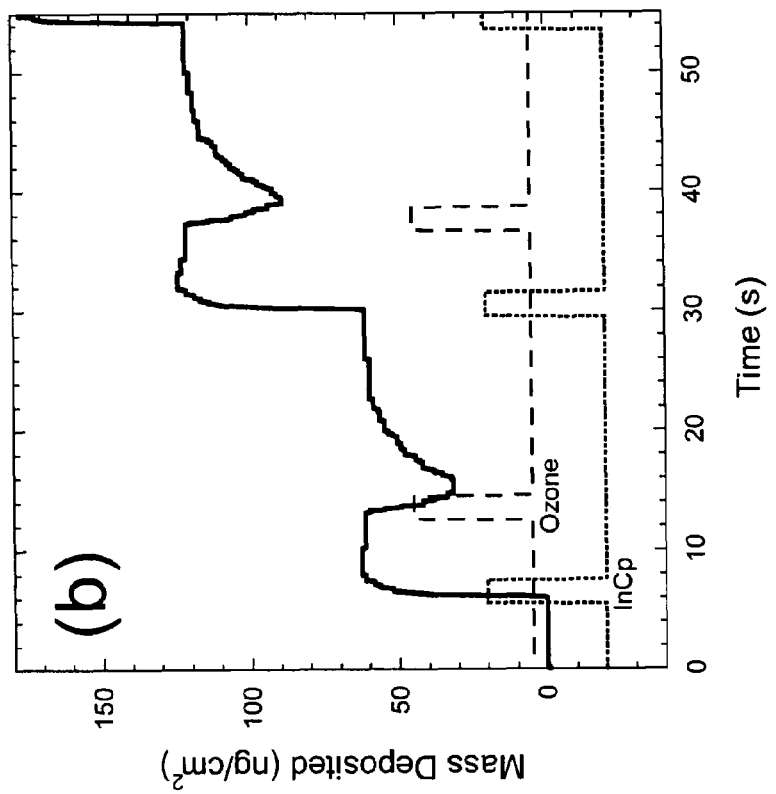
FIG. 13B Illustrates expanded view of FIG. 13A showing correlation between QCM signal (solid line) and exposures to InCp (dotted line) and $O_3$ (dashed line).
Figure 13A:
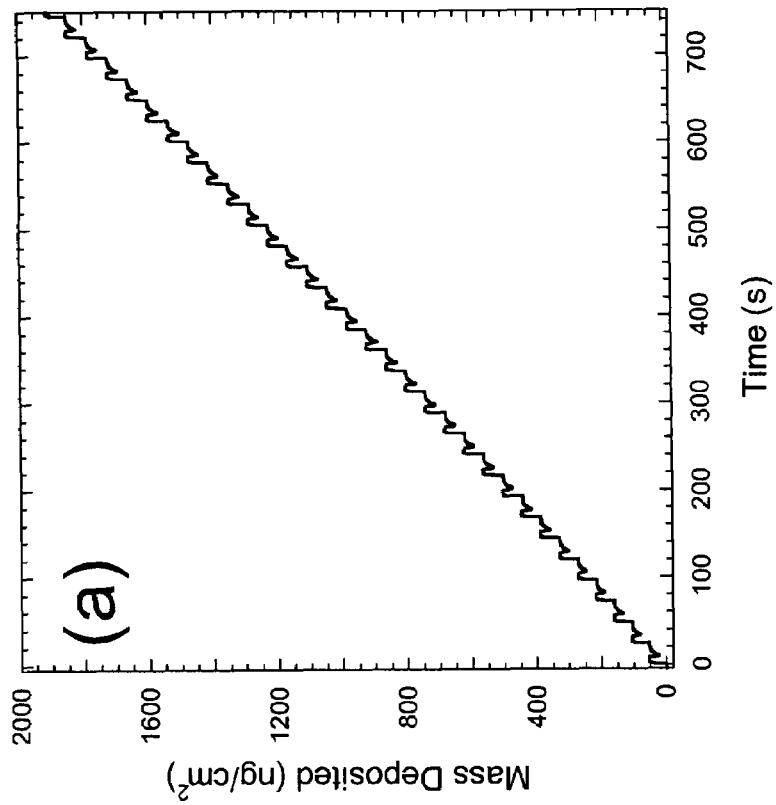
FIG. 13A illustrates QCM signal versus time during alternating exposures to InCp and $O_3$ at 250° C. using the timing sequence: 2-5-2-15.

FIG. 13A also shows the QCM data recorded simultaneously with the QMS measurements demonstrating that alternating InCp/$O_3$ exposures results in a linear mass increase versus time. The slope of the data in FIG. 13A yields a net mass change of 55 ng/cm²/cycle. Assuming a bulk density for $In_2O_3$ of 7.19 g/cm², this corresponds to a growth rate of 0.76 Å/cycle. As described in the next section, this growth rate is lower than the 1.3-2.0 Å/cycle measured on Si(100) substrates. This difference arises because the QCM is located 33 cm downstream from the substrates where the $O_3$ concentration is lower.

FIG. 13B shows an expanded view of the QCM data for two ALD cycles. There is an abrupt mass increase during each InCp exposure and a transient mass decrease coincident with each $O_3$ exposure followed by a slow increase such that the net mass change produced by the $O_3$ exposures is almost zero. We attribute the apparent mass decrease during the $O_3$ exposures to a transient heating of the QCM produced by the thermal decomposition of $O_3$ or the oxidation of the Cp ligands. The mass changes produced by the individual half-reactions can predict the fraction of Cp ligands remaining on the surface after the InCp exposures. Using the relationship R=Δm/Δm₂, where Δm is the mass change from one complete cycle and Δm₂ is the mass change during reaction 1, we calculate from eqs 1 and 2 and the atomic masses that Δm(InO$_{1.5}$)=139 and Δm₂[In+(x)Cp]=115+65x so that R=139/(115+65x). From FIG. 13B, R=1.0 so that x=0.37 which implies that, on average, 37% of the Cp ligands remain on the surface after reaction 1. This value is somewhat higher than the value x=0.15 calculated from the QMS data. This difference probably arises from uncertainties in the QMS parameters used to calculate the cyclopentadiene and $CO_2$ concentrations or from inaccuracies in the QCM data caused by the temperature-induced transient feature during the $O_3$ exposures. Nevertheless, the primary conclusion from the QCM data is the same as from the QMS data: a majority of the Cp ligands are lost during the InCp exposures, and the small fraction remaining is subsequently removed during the following $O_3$ exposure.

One additional finding from the in situ measurements is that the reactive oxygen species during the $In_2O_3$ ALD is most probably oxygen radicals formed by the thermal decomposition of ozone ($O_3 \rightarrow O_2+O$). This process occurs primarily on the $In_2O_3$ surface but also to a lesser degree on other surfaces (e.g., $Al_2O_3$) or possibly in the gas phase. The $In_2O_3$ growth rate drops off abruptly at 200° C. to nearly zero (see FIG. 3B) suggesting that we must exceed a threshold temperature for ozone decomposition to enable $In_2O_3$ growth. This interpretation is supported by the observation that the m=48 QMS signal from ozone is ~10× larger at temperatures below 200° C. Furthermore, $In_2O_3$ appears to catalyze $O_3$ decomposition more efficiently than $Al_2O_3$ or gas-phase decomposition. When we first executed InCp/$O_3$ cycles following $Al_2O_3$ growth, we determined the m=48 signal is initially high but decreases nearly to zero following 40-50 $In_2O_3$ cycles. More-over, in situ QCM measurements reveal that the $In_2O_3$ growth is initially inhibited following $Al_2O_3$ growth. Taken together, these results suggest that ozone decomposes on the growing surface to form a more active oxidizing species. This species is most likely a surface-bound oxygen radical or possibly a surface peroxide.

To summarize the in situ measurements, we can rewrite eqs (1) and (2) with the unknown surface species, gaseous products, and oxidant filled in:

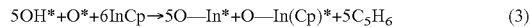  (3)

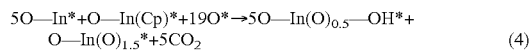  (4)

In reaction 3, the initial reactive sites are five OH groups and one surface oxygen species. Six InCp molecules react with the surface liberating five cyclopentadiene molecules and leaving one Cp ligand on the surface. In reaction 4, surface-bound oxygen species formed by the decomposition of $O_3$ release the carbon from the remaining Cp ligand as five $CO_2$, but the hydrogen atoms remain to reform five new hydroxyl groups. Consequently, reaction 4 regenerates the initial surface and forms $In_2O_3$ with the proper stoichiometry, $In/O=1:1.5$. Reactions 3 and 4 yield $x=\frac{1}{6}=0.17$, which is in the range of $x=0.15\text{-}0.37$ determined from the in situ measurements. Although somewhat speculative, this mechanism has the appeal that the single remaining Cp ligand will exactly balance the five OH groups so that no hydrogen-containing products are released during the $O_3$ reaction. Although the indium oxidation state is not explicit in reactions 3 and 4, the conversion from $In^1+$ to $In^{3}+$ probably occurs mostly during the ozone step. In situ measurements using infrared absorption spectroscopy could verify the existence of OH groups following the $O_3$ exposures. If oxygen radicals are indeed the active oxidizing species in this process, then substituting an oxygen plasma in place of the $O_3$ may allow $In_2O_3$ growth below 200° C.

The foregoing description of embodiments of the present invention have been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments, and with various modifications, as are suited to the particular use contemplated.

What is claimed is:

1. A method of preparing a light transmitting and electrically conductive oxide film comprising the steps of:
    performing an atomic layer deposition by the steps of:
    Providing a first precursor of cyclopentadienyl indium (I);
    Inputting to the deposition system the first precursor for a first selected time interval for reaction of the first precursor;
    Providing a second precursor comprised of ozone;
    Inputting to the deposition system the second precursor for a second elected time interval for reaction of the second precursor; and
    Alternating for a predetermined number of cycles each of the reactions of the first and second precursor for the first and second selected time to produce a light transmitting and electrically conductive oxide film.

2. The method as defined in claim 1 further including the step of inputting a purge gas between each cycle of inputting a first and second precursor into the deposition system.

3. The method as defined in claim 2 wherein the purge gas comprises an inert gas.

4. The method as defined in claim 3 wherein the inert gas consists essentially of N2.

5. The method as defined in claim 1 further including the step of providing a high aspect ratio between about 1:300 and about 1:2300 to receive the oxide film.

6. The method as defined in claim 1 further including the steps of: providing a third precursor of tetrakis(dimethylamino) tin:
    Inputting to the deposition system the third precursor for reaction of the third precursor;
    Providing a fourth precursor of hydrogen peroxide; and
    Inputting to the deposition system the fourth precursor for reaction of the fourth precursor;
    wherein mixing the first precursor and the third precursor forms a doped conductive oxide film.

7. The method as defined in claim 6 further including the step of controlling temperatures of a substrate which receives the oxide film.

8. The method as defined in claim 7 wherein the substrate temperature is maintained between about:
    200 C and about 450 C for the first precursor;
    50 C and about 325 C for the third precursor; and
    200 C and bout 325 C for mixture of the first precursor and the third precursor.

9. The method as defined in claim 6 further including at least two different cycles of inputting the first precursor and the third precursor to form a preselected composition for a ternary film.

10. The method as defined in claim 9 wherein a number of cycles and time of each of the cycles of the first precursor and the third precursor is adjusted to obtain a preselected film property selected from the group of controlled light transmission and controlled electrical conductivity.

11. The method as defined in claim 9 wherein time and number of cycles of ozone and hydrogen peroxide are adjusted to obtain a preselected film property selected from the group of controlled light transmission and controlled electrical conductivity.

12. A method of preparing a light transmitting and electrically conductive oxide film comprising the stages of:
    performing an atomic layer deposition by the steps of:
    Heating a substrate in the deposition system to a predetermined temperature;
    Providing a first precursor of cyclopentadienyl indium (I);
    Inputting to the deposition system the first precursor for a first selected time interval for reaction of the first precursor;
    Providing a second precursor comprised of an oxidizer;
    Inputting a purge gas between each cycle of the first precursor for a second selected time;
    Alternating for a predetermined number of cycles each of the reactions of the first and second precursor for the first and second selected time to produce a light transmitting and electrically conductive oxide film;
    Inputting the purge gas between each cycle of the second precursor; and alternating for a predetermined number of cycles each of the reactions of the first precursor, the second precursor and the purge gas for an associated time to produce the light transmitting and electrically conductive oxide film as the substrate;
    wherein the oxidizer is ozone.

13. The method as defined in claim 12 further including the steps of coupling the oxide film to a system for performing a preselected function.

14. The method as defined in claim 12 wherein the predetermined temperature is maintained between about 200 C and about 450 C.

15. The method as defined in claim 12 wherein the substrate is characterized by an aspect ratio between about 1:300 and about 1:2300.

16. A method of preparing an indium oxide film comprising the steps of:
 performing an atomic layer deposition by the steps of:
 providing a substrate;
 providing a first precursor comprising cyclopentadienyl indium(I);
 providing a second precursor comprising a first oxidizer;
 providing a thirds precursor comprising tetrakis(dimethylamino)tin;
 providing a fourth precursor comprising a fourth precursor comparing a second oxidizer;
 Inputting to the deposition system the first precursor for a first selected time interval;
 Inputting to the deposition system the second precursor for a second selected tome interval for reaction with the first precursor;
 Inputting to the deposition the third precursor for a third selected time interval;
 Inputting to the deposition system the fourth precursor for a fourth selected time interval for a reaction with the third precursor;
 Alternating for a number of cycles inputting each of the first, second a third and fourth precursors to produce a light transmitting and electrically conductive indium tin oxide film on the substrate;
 wherein the first oxidizer is ozone.

17. The method as defined in claim 16 wherein the first oxidizer comprises ozone, and wherein the second oxidizer comprises hydrogen peroxide.

18. The method as defined in claim 16 further including the step of coupling the oxide film to a system for performing a preselected function.

* * * * *